(12) United States Patent
Zhang

(10) Patent No.: US 11,482,546 B2
(45) Date of Patent: Oct. 25, 2022

(54) METHOD OF FABRICATING ARRAY SUBSTRATE

(71) Applicant: WUHAN CHINA STAR OPTOELECTRONICS SEMICONDUCTOR DISPLAY TECHNOLOGY CO., LTD., Wuhan (CN)

(72) Inventor: Le Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 83 days.

(21) Appl. No.: 17/261,563

(22) PCT Filed: Jun. 24, 2020

(86) PCT No.: PCT/CN2020/098262
§ 371 (c)(1),
(2) Date: Jan. 19, 2021

(87) PCT Pub. No.: WO2021/248568
PCT Pub. Date: Dec. 16, 2021

(65) Prior Publication Data
US 2022/0157862 A1     May 19, 2022

(30) Foreign Application Priority Data
Jun. 9, 2020   (CN) .......................... 202010518517.5

(51) Int. Cl.
*H01L 29/12*     (2006.01)
*H01L 27/12*     (2006.01)
(Continued)

(52) U.S. Cl.
CPC ........ *H01L 27/1251* (2013.01); *H01L 27/127* (2013.01); *H01L 27/1222* (2013.01);
(Continued)

(58) Field of Classification Search
CPC ............. H01L 27/1251; H01L 27/1222; H01L 27/127; H01L 27/1288; H01L 29/66757;
(Continued)

(56) References Cited

U.S. PATENT DOCUMENTS

2009/0278131 A1    11/2009  Kwon et al.
2018/0061868 A1*    3/2018  Na .................... H01L 29/78672
(Continued)

FOREIGN PATENT DOCUMENTS

CN         101577283  A      11/2009
CN         105390551  A       3/2016
(Continued)

*Primary Examiner* — Mohammed R Alam
(74) *Attorney, Agent, or Firm* — The Roy Gross Law Firm, LLC; Roy Gross

(57) ABSTRACT

A display panel driving circuit, an array substrate, and a method of fabricating the array substrate are provided. The display panel driving circuit includes a plurality of transistors. The transistors include a low leakage current thin-film transistor including a semiconductor layer. The semiconductor layer includes a first semiconductor layer and a second semiconductor layer disposed on the first semiconductor layer. A material of the first semiconductor layer or the second semiconductor is low-temperature polysilicon, and a material of the other has a carrier mobility less than a carrier mobility of the low-temperature polysilicon.

3 Claims, 5 Drawing Sheets

(51) Int. Cl.
    *H01L 29/66*     (2006.01)
    *H01L 29/786*    (2006.01)
    *H01L 27/32*     (2006.01)

(52) U.S. Cl.
    CPC .... *H01L 27/1288* (2013.01); *H01L 29/66757* (2013.01); *H01L 29/78675* (2013.01); *H01L 27/3262* (2013.01)

(58) Field of Classification Search
    CPC .......... H01L 29/78675; H01L 27/3262; H01L 27/1233; H01L 27/1229; H01L 29/7869; H01L 29/78696; H01L 27/1225; H01L 27/1214; H01L 27/1259; H01L 27/3244
    See application file for complete search history.

(56) References Cited

U.S. PATENT DOCUMENTS

2018/0286307 A1* 10/2018 Kim ................... H01L 27/1222
2019/0006448 A1    1/2019  Zhou

FOREIGN PATENT DOCUMENTS

| CN | 106057826 A | 10/2016 |
| CN | 107134461 A |  9/2017 |
| JP | H0555570 A  |  3/1993 |

* cited by examiner

METHOD OF FABRICATING ARRAY SUBSTRATE

CROSS REFERENCE TO RELATED APPLICATIONS

This application is a National Phase of PCT Patent Application No. PCT/CN2020/098262 having International filing date of Jun. 24, 2020, which claims the benefit of priority of Chinese Application No. 202010518517.5 filed Jun. 9, 2020. The contents of the above applications are all incorporated by reference as if fully set forth herein in their entirety.

FIELD OF INVENTION

The present disclosure relates to the technical field of display, and particularly to a display panel driving circuit, an array substrate, and a method of fabricating the array substrate.

BACKGROUND

Active matrix organic light emitting diode (AMOLED) displays have developed rapidly due to their unique advantages. Array substrates used for AMOLEDs are mainly low-temperature polysilicon (LTPS) positive channel metal oxide semiconductor (PMOS) array substrates. In manufacturing processes of LTPS PMOS array substrates, it is difficult to ensure uniformity of formed large-area polysilicon semiconductors, which causes threshold voltage drifts.

In order to solve the problem of poor uniformity of LTPS of AMOLED, a sub-pixel driving circuit of an LTPS array substrate of AMOLED needs to use a pixel compensation circuit to offset influences of threshold voltage drifts. Current mainstream pixel compensation circuits are designed as 7T1C circuits. 7T1C circuits have three working stages: (1) initial restoration stage, (2) circuit compensation stage, and (3) pixel light-emitting stage. Because the pixel light-emitting stage takes a long time, a capacitance potential in a compensation circuit will gradually decrease due to long-term current leakage, resulting in abnormal light emission of pixels. A tailing of an LTPS PMOS thin-film transistor (TFT) in a cut-off area intensifies leakage current of the TFT. In order to reduce leakage current, a current solution is to apply a large bias voltage to a gate electrode and a source electrode of a TFT, that is, TFT-aging. TFT-aging cannot age TFTs in areas other than an active-matrix (AA) area, such as a gate driver on array (GOA) area.

SUMMARY OF DISCLOSURE

In view of this, a purpose of the present disclosure is to provide a display panel driving circuit, an array substrate, and a method of fabricating the array substrate that can prevent abnormal light emission of pixels caused by current leakage of thin-film transistors without aging.

The present disclosure provides a display panel driving circuit comprising a plurality of transistors. The transistors comprise a low leakage current thin-film transistor comprising a semiconductor layer. The semiconductor layer comprises a first semiconductor layer and a second semiconductor layer disposed on the first semiconductor layer. A material of the first semiconductor layer or the second semiconductor is low-temperature polysilicon, and a material of the other has a carrier mobility less than a carrier mobility of the low-temperature polysilicon.

In an embodiment, the low leakage current thin-film transistor is disposed at a first position in a display panel driving circuit to reduce influences of a leakage current at the first position in the display panel driving circuit.

In an embodiment, the material having the carrier mobility less than the carrier mobility of the low-temperature polysilicon comprises one or more of a metal oxide semiconductor, a metal nitride semiconductor, a metal oxynitride semiconductor, and an amorphous silicon.

In an embodiment, the material of the first semiconductor layer is low-temperature polysilicon. The material of the second semiconductor layer has the carrier mobility less than the carrier mobility of the low-temperature polysilicon. The first semiconductor layer comprises a channel region and doped regions respectively disposed on both sides of the channel region. An orthographic projection of the second semiconductor layer on the channel region is within the channel region.

In an embodiment, the doped regions are P-type doped regions.

In an embodiment, the transistors further comprise a low-temperature polysilicon thin-film transistor. The low-temperature polysilicon thin film transistor and the low-leakage current thin-film transistor are simultaneously formed on a substrate.

In an embodiment, the low leakage current thin-film transistor and the low-temperature polysilicon thin-film transistor are both N-type transistors or P-type transistors.

In an embodiment, the low-temperature polysilicon thin-film transistor is disposed at a second position in the display panel driving circuit. The second position is a position other than the first position in the display panel driving circuit.

The present disclosure further provides an array substrate comprising the display panel driving circuit as described above.

The present disclosure further provides a method of fabricating an array substrate comprising:

providing a substrate;

sequentially forming a first semiconductor material layer, a second semiconductor material layer, and a photoresist layer on the substrate, wherein a material of the first semiconductor layer or the second semiconductor is low-temperature polysilicon, and a material of the other has a carrier mobility less than a carrier mobility of the low-temperature polysilicon;

exposing and developing the photoresist layer using a halftone mask to form a first protective layer, second protective layers, and a third protective layer, wherein the second protective layers are connected to both sides of the first protective layer, a thickness of the first protective layer is greater than that of the second protective layers, and the third protective layer is spaced apart from the first protective layer and the second protective layers;

removing the first semiconductor material layer and the second semiconductor material layer not covered by the first protective layer, the second protective layers, and the third protective layer by a first etching to form a first semiconductor layer and a third semiconductor layer;

ashing to remove the second protective layers and the third protective layer and thin the first protective layer;

removing the second semiconductor material layer not covered by the first protective layer by a second etching to form a second semiconductor layer; and removing the first protective layer.

The present invention can reduce leakage current of thin-film transistors (TFTs) in a display panel driving circuit by replacing a low-temperature polysilicon thin-film transistor in the prior art with a low-leakage current thin-film transistor, thereby preventing abnormal light emission of pixels caused by current leakage of the TFTs. And, in a manufacturing process, a step of aging is omitted.

BRIEF DESCRIPTION OF DRAWINGS

In order to more clearly illustrate technical solutions in the present disclosure, a brief description of accompanying drawings used in a description of embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in the present disclosure will be clearly and completely described below in conjunction with accompanying drawings in embodiments of the present disclosure. Apparently, the described embodiments are merely some of the embodiments of the present disclosure and not all embodiments. All other embodiments obtained by those skilled in the art based on the embodiments of the present disclosure without creative labor are within the claimed scope of the present invention.

In all embodiments of the present disclosure, transistors may be thin-film transistors, field-effect transistors, or other devices with same characteristics. Because a source electrode and a drain electrode of each of the transistors used herein are symmetrical, the source electrode and the drain electrode are interchangeable. In the embodiments of the present disclosure, in order to distinguish two electrodes of each of the transistors except a gate electrode, one of the electrodes is called a source electrode, and the other electrode is called a drain electrode. According to the accompanying drawings, a middle end of a switching transistor is defined as a gate electrode, a signal input end of the switching transistor is defined as a source electrode, and a signal output end of the switching transistor defined as a drain electrode. In addition, in the embodiments of the present disclosure, the transistors may comprise P-type transistors and/or N-type transistors. A P-type transistor turns on when its gate electrode is at a low level, and turns off when its gate electrode is at a high level. An N-type transistor turns on when its gate electrode is at high level, and turns off when its gate electrode is at low level.

Figure 1:
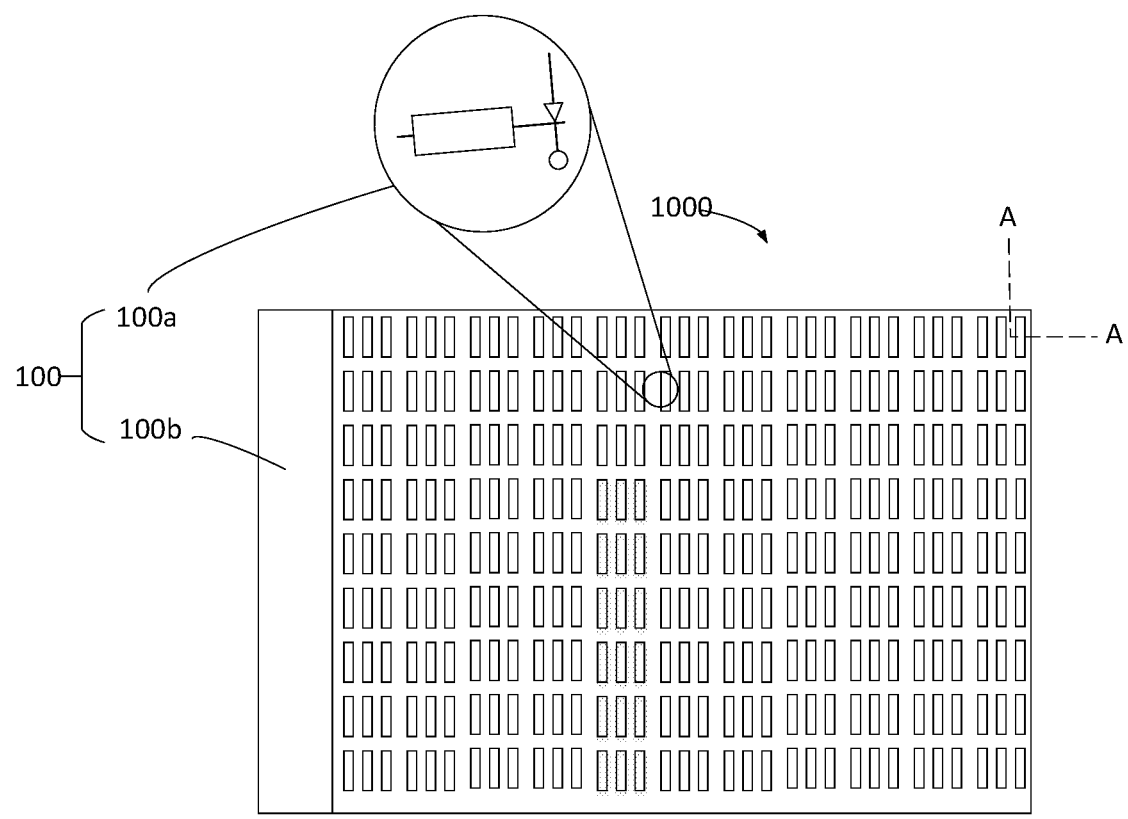
FIG. 1 is a schematic plan view of an array substrate according to a first embodiment of the present disclosure.
Figure 2:
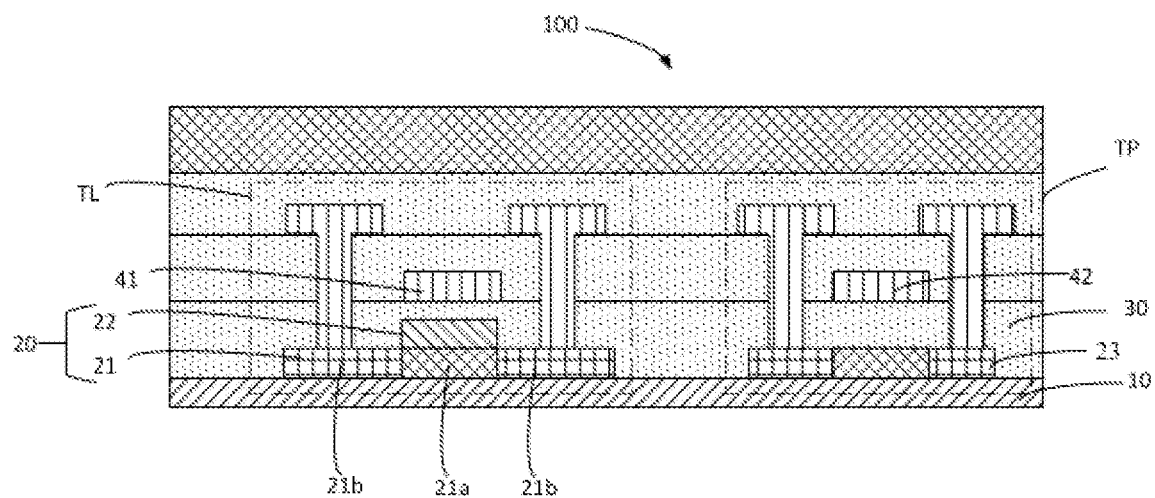
FIG. 2 is a schematic cross-sectional view of the array substrate of FIG. 1 along line A-A.

Please refer to FIG. 1 and FIG. 2, the present disclosure provides an array substrate 1000. The array substrate 1000 may be used for OLED, such as AMOLED. The array substrate 1000 comprises a substrate 10 and a display panel driving circuit disposed on the substrate 10. The display panel driving circuit 100 comprises a plurality of transistors. The transistors comprise a low leakage current thin-film transistor TL. The low leakage current thin-film transistor TL is disposed at a first position P1 in the display panel driving circuit 100 to reduce influences of a leakage current at the first position P1 on the display panel driving circuit 100. The transistors may further comprise a low-temperature polysilicon thin-film transistor TP. The low-temperature polysilicon thin-film transistor TP is disposed at a second position P2 in the display panel driving circuit 100. The second position P2 is a position other than the first position P1 in the display panel driving circuit 100. The low leakage current thin-film transistor TL and the low-temperature polysilicon thin-film transistor TP are both N-type transistors or P-type transistors. And, the low leakage current thin-film transistor TL and the low-temperature polysilicon thin-film transistor TP are simultaneously formed on the substrate 10.

The low leakage current thin-film transistor TL comprises a semiconductor layer 20, a gate insulating layer 30 disposed on the semiconductor layer 20, a first gate electrode 41 disposed on the gate insulating layer 30, an interlayer insulating layer disposed on the first gate electrode 41, and source and drain electrodes disposed on the interlayer insulating layer.

The semiconductor layer 20 comprises a first semiconductor layer 21 and a second semiconductor layer 22 disposed on the first semiconductor layer 21. A material of the first semiconductor layer 21 or the second semiconductor layer 22 is low-temperature polysilicon, and a material of the other has a carrier mobility less than a carrier mobility of the low-temperature polysilicon. The material having the carrier mobility less than the carrier mobility of the low-temperature polysilicon comprises one or more of a metal oxide semiconductor, a metal nitride semiconductor, a metal oxynitride semiconductor, and an amorphous silicon, specifically, one or more of indium gallium zinc oxide, indium tin zinc oxide, indium zinc oxide, indium tin oxide, zinc oxide, tin oxide, gallium zinc oxide, zinc oxynitride, tin oxynitride, and the like.

In this embodiment, the material of the first semiconductor layer 21 is low-temperature polysilicon.

In the prior art, a semiconductor layer of a low-temperature polysilicon thin-film transistor is only formed of low-temperature polysilicon, which causes electrons to pass through the low-temperature polysilicon regardless of whether the thin-film transistor is in an on state or an off state. Because the low-temperature polysilicon has a high carrier mobility, in the off state, a current has a high carrier mobility and a high carrier concentration, that is, a large leakage current. However, when the thin-film transistor provided in this embodiment is in an on state, because a carrier mobility of the first semiconductor layer 21 is higher than that of the second semiconductor layer 22, the first semiconductor layer 21 will attract electrons. Therefore, the electrons pass through the first semiconductor layer 21. The first semiconductor layer 21 has a high carrier mobility, so that an on-state current with a high carrier mobility and a high carrier concentration can be obtained. When the thin-film transistor is in an off state, because there are almost no electrons in the first semiconductor layer 21, the first semiconductor layer 21 becomes a depletion layer, which will repel electrons. Therefore, electrons will pass through the second semiconductor layer 22. The second semiconductor layer 22 has a low carrier mobility, so that a leakage current with a low carrier mobility and a low carrier concentration is obtained. That is, the leakage current is reduced.

In this embodiment, the second semiconductor layer 22 is disposed on the first semiconductor layer 21. That is, the first semiconductor layer 21 is formed first, and then the second semiconductor layer 22 is formed, so that the low-temperature polysilicon can be formed on a flat surface without step difference. This ensures that the first semiconductor layer 21 has good electrical properties. Of course, the second semiconductor layer 22 may also be disposed below the first semiconductor layer 21, which is not limited in this embodiment.

In this embodiment, the first semiconductor layer 21 comprises a channel region 21a and doped regions 21b respectively disposed on both sides of the channel region 21. The doped regions 21b are P-type doped regions. An orthographic projection of the second semiconductor layer 22 on the channel region 21a is within the channel region 21a. The first gate electrode 41 is disposed corresponding to the channel region 21a. The source and drain electrodes are electrically connected to the doped regions 21b.

The low-temperature polysilicon thin-film transistor TP comprises a third semiconductor layer 23, the gate insulating layer 30 disposed on the third semiconductor layer 23, a second gate electrode 42 disposed on the gate insulating layer 30 and disposed corresponding to the third semiconductor layer 23, and source and drain electrodes electrically connected to the third semiconductor layer 23. The third semiconductor layer 23 is also provided with doped regions.

The display panel driving circuit 100 may comprise a pixel compensation circuit 100a and a gate driver on array circuit 100b.

The pixel compensation circuit 100a may be a pixel compensation circuit in the prior art such as 4T1C, 5T1C, and 7T1C circuits.

In the following description, the pixel compensation circuit 100a is exemplified by a 7T1C compensation circuit.

Figure 3:
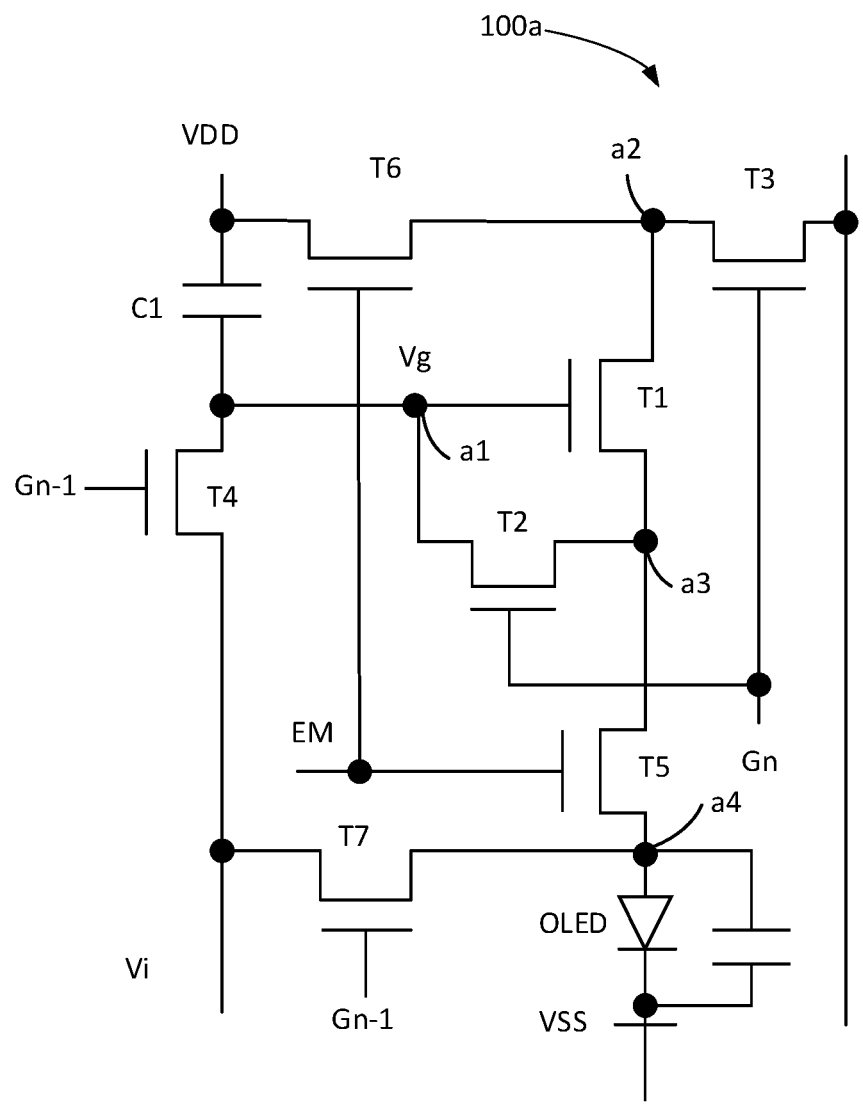
FIG. 3 is an equivalent circuit diagram of a pixel compensation circuit of the array substrate of FIG. 1.
Figure 4A:
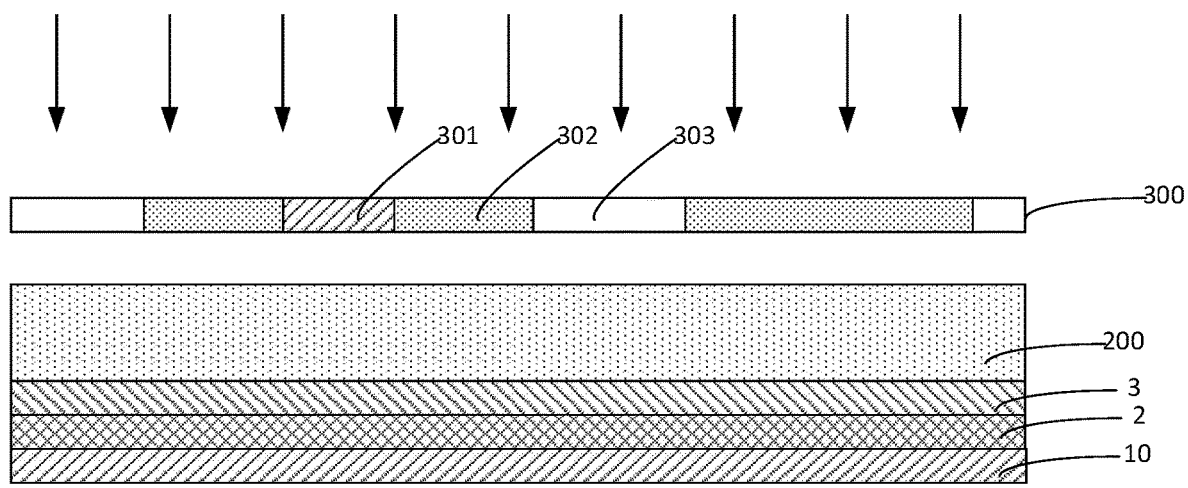
FIG. 4(a) to FIG. 4(h) are schematic flowcharts of a method for fabricating an array substrate according to a second embodiment of the present disclosure.
Figure 4B:
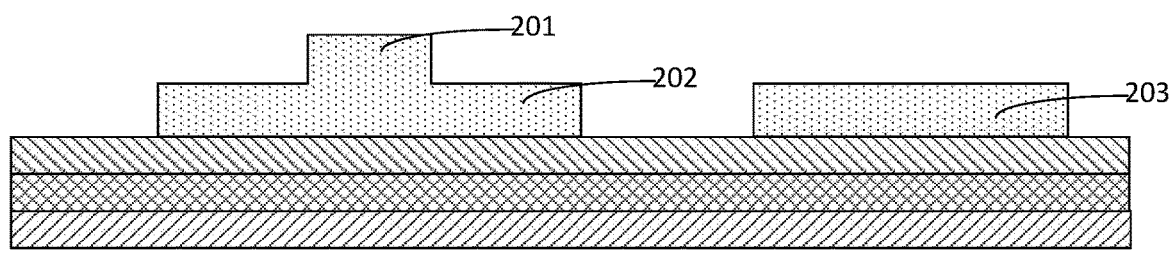
Figure 4C:
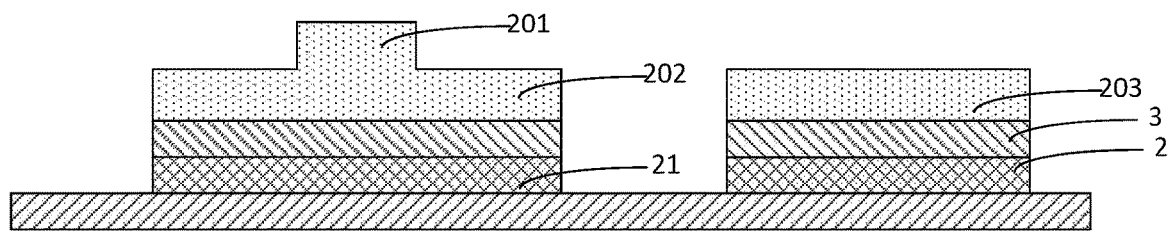
Figure 4D:
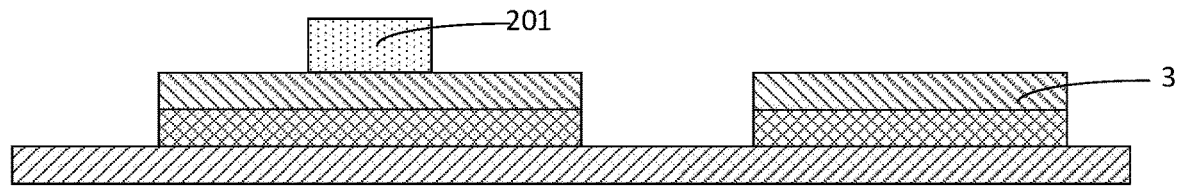
Figure 4E:
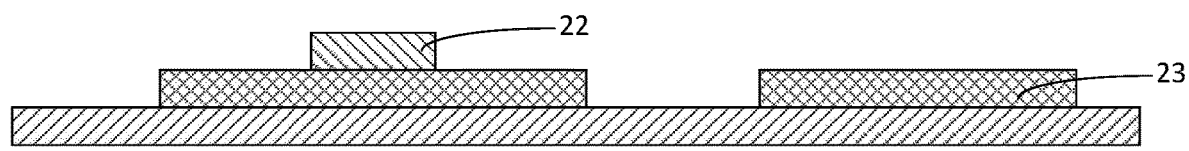
Figure 4F:
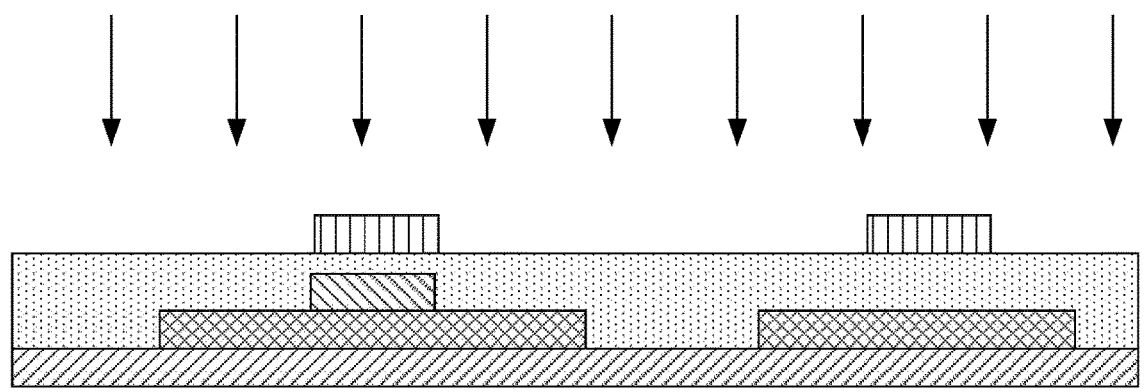
Figure 4G:
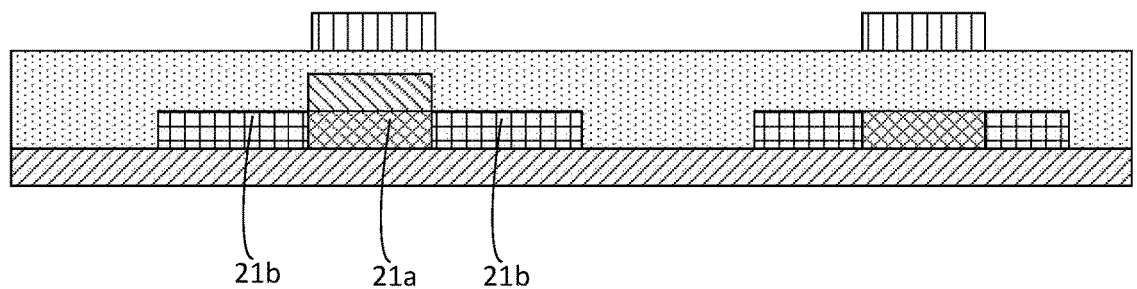
Figure 4H:
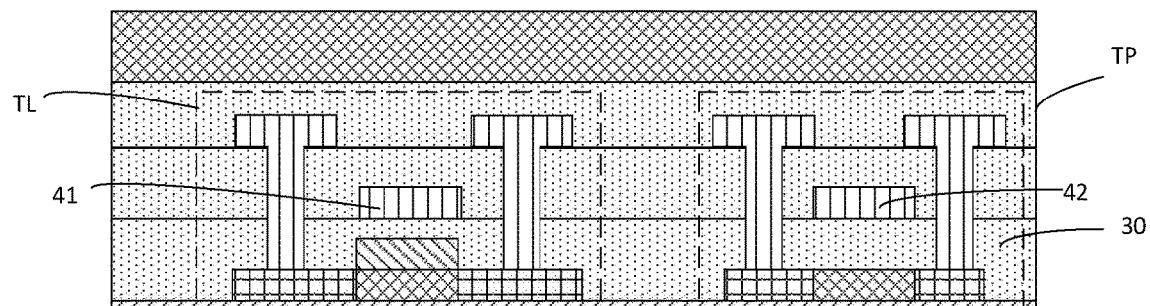

Please refer to FIG. 3, the pixel compensation circuit 100a comprises a first transistor T1, a second transistor T2, a third transistor T3, a fourth transistor T4, a fifth transistor T5, a sixth transistor T6, a seventh transistor T7, a first capacitor C1, and a light emitting device OLED.

A gate electrode of the first transistor T1 is electrically connected to a first node a1. A source electrode of the first transistor T1 is electrically connected to a second node a2. A drain electrode of the first transistor T1 is electrically connected to a third node a3.

A gate electrode of the second transistor T2 is electrically connected to a first scan signal. A source electrode of the second transistor T2 is electrically connected to the first node a1. A drain electrode of the second transistor T2 is electrically connected to the third node a3.

A gate electrode of the third transistor T3 is electrically connected to the first scan signal. A source electrode of the third transistor T3 is electrically connected to a data signal. A drain electrode of the third transistor T3 is electrically connected to the second node a2. The first scan signal is provided by a current-stage gate line Gn. The data signal is provided by a data line.

A gate electrode of the fourth transistor T4 is electrically connected to a second scan signal. A source electrode of the fourth transistor T4 is electrically connected to a low-level voltage Vi. A drain electrode of the fourth transistor T4 is electrically connected to the first node a1. The second scan signal is provided by a next-stage gate line Gn-1.

A gate electrode of the fifth transistor T5 is electrically connected to a light emitting signal EM. A source electrode of the fifth transistor T5 is electrically connected to the third node a3. A drain electrode of the fifth transistor T5 is electrically connected to a fourth node a4.

A gate electrode of the sixth transistor T6 is electrically connected to the light emitting signal EM. A source electrode of the sixth transistor T6 is electrically connected to a first power signal VDD. A drain electrode of the sixth transistor T6 is electrically connected to the second node a2. The first power signal VDD is provided by a power supply voltage.

A gate electrode of the seventh transistor T7 is electrically connected to the second scan signal. A source electrode of the seventh transistor T7 is electrically connected to the low-level voltage Vi. A drain electrode of the seventh transistor T7 is electrically connected to the fourth node a4. The second scan signal is provided by the next-stage gate line Gn-1.

A first terminal of the first capacitor C1 is electrically connected to the first node a1, and a second terminal of the first capacitor C1 is electrically connected to the first power signal.

An anode terminal of the light emitting device OLED is electrically connected to the fourth node a4, and a cathode terminal of the light emitting device OLED is electrically connected to a second power signal. The second power signal is a ground signal.

The first transistor T1, the second transistor T2, the third transistor T3, the fourth transistor T4, the fifth transistor T5, the sixth transistor T6, and the seventh transistor T7 may be the low leakage current thin-film transistors TL and the low-temperature polysilicon thin-film transistors TP. In an embodiment, because the second transistor T2 and the fourth transistor T4 are highly sensitive to leakage current in the 7T1C circuit, the second transistor T2 and the fourth transistor T4 may be set as the low leakage current thin-film transistors TL. The first transistor T1, the third transistor T3, the fifth transistor T5, the sixth transistor T6, and the seventh transistor T7 are set as the low-temperature polysilicon thin-film transistors TP. Replacing a low-temperature polysilicon thin-film transistor in the prior art with a low-leakage current thin-film transistor can greatly reduce leakage current of thin-film transistors (TFTs) of a low-temperature polysilicon (LTPS) substrate, thereby preventing abnormal light emission of pixels. And, in a manufacturing process, a step of aging is omitted.

Similarly, the gate driver on array circuit 100b may also comprise the low leakage current thin-film transistors TL. For example, the gate driver on array circuit 100b all use the low leakage current thin-film transistors TL. Alternately, a part of the gate driver on array circuit 100b adopts the low leakage current thin-film transistors TL, and a part of the gate driver on array circuit 100b adopts general thin-film transistors such as the low-temperature polysilicon thin-film transistors TP.

Please refer to FIG. 4(a) to FIG. 4(h), a second embodiment of the present disclosure further provides a method of fabricating an array substrate, which is used to fabricate the array substrate 1000 of the first embodiment of the present disclosure. The method comprises the following steps.

S1: providing a substrate 10, and sequentially forming a first semiconductor material layer 2, a second semiconductor material layer 3, and a photoresist layer 200 on the substrate 10.

A light-shielding layer, a buffer layer, and the like may be formed on the substrate 10.

A material of the first semiconductor material layer 2 or the second semiconductor material layer 3 is low-temperature polysilicon, and a material of the other has a carrier mobility less than a carrier mobility of the low-temperature polysilicon. The material having the carrier mobility less than the carrier mobility of the low-temperature polysilicon comprises one or more of a metal oxide semiconductor, a metal nitride semiconductor, a metal oxynitride semiconductor, and an amorphous silicon, specifically, one or more of indium gallium zinc oxide, indium tin zinc oxide, indium zinc oxide, indium tin oxide, zinc oxide, tin oxide, gallium zinc oxide, zinc oxynitride, tin oxynitride, and the like.

In this embodiment, the material of the first semiconductor material layer 2 is low-temperature polysilicon.

S2: exposing and developing the photoresist layer 200 using a halftone mask 300 to form a first protective layer 201, second protective layers 202, and a third protective layer 203. The second protective layers 202 are connected to both sides of the first protective layer 201. A thickness of the first protective layer 201 is greater than that of the second protective layers 202. The third protective layer 203 is spaced apart from the first protective layer 201 and the second protective layers 202.

The halftone mask 300 comprises an opaque region 301, semi-transparent regions 302, and transparent regions 303. In a case of using a positive photoresist, the opaque region 301 is used to form the first protective layer 201, the semi-transparent regions 302 are used to form the second protective layers 202 and the third protective layer 203, and the transparent regions 303 correspond to other parts of the photoresist layer 200.

S3: removing the first semiconductor material layer 2 and the second semiconductor material layer 3 not covered by the first protective layer 201, the second protective layers 202, and the third protective layer 203 by a first etching to form a first semiconductor layer 21 and a third semiconductor layer 23.

S4: ashing to remove the second protective layers 202 and the third protective layer 203 and thin the first protective layer 201.

S5: removing the second semiconductor material layer 3 not covered by the first protective layer 201 by a second etching to form a second semiconductor layer 22, and removing the first protective layer 201.

S6: forming a gate insulating layer 30, a first gate electrode 41, and a second gate electrode 42 on the second semiconductor layer 22 and the third semiconductor layer 23, and doping the first semiconductor layer 21 with the first gate electrode 41 as a shielding layer to form a channel region 21a and doped regions 21b located on both sides of the channel region 21a. In this step, the low-temperature polysilicon in the first semiconductor layer 21 is implanted with a trivalent element to form a P-type doped semiconductor with better conductivity. At the same time, PN junctions are formed at both sides of the first gate electrode 41 to form a TFT. The doped first semiconductor layer 21 and the second semiconductor layer 22 together form a semiconductor layer of a low leakage current thin-film transistor TL.

At the same time, the third semiconductor layer 23 is doped with the second gate electrode 42 as a shielding layer. The doped third semiconductor layer 23 is used as a semiconductor layer of a low-temperature polysilicon thin-film transistor TP.

In this embodiment, it is exemplified that thin-film transistors in the array substrate are top-gate thin-film transistors. In a bottom-gate thin-film transistor, the first semiconductor layer 21 and the third semiconductor layer 23 may be doped. The doping may use methods in the prior art, which will not be described in detail herein.

The method of fabricating the array substrate in this embodiment further comprises forming an interlayer insulating layer and source and drain electrodes on the first gate electrode 41 and the second gate electrode 42 to form the low leakage current thin-film transistor TL and the low-temperature polysilicon thin-film transistor TP.

The pixel compensation circuit 100a and the gate driver on array circuit 100b of the array substrate 1000 in the first embodiment of the present disclosure can be made by the above method.

A method of fabricating an array substrate of the present disclosure can reduce leakage current of TFTs in the array substrate by replacing a low-temperature polysilicon thin-film transistor in the prior art with a low-leakage current thin-film transistor, thereby preventing abnormal light emission of pixels caused by current leakage of the TFTs. In a manufacturing process of a pixel compensation circuit and a gate driver on array circuit of the array substrate, a step of aging can be omitted.

The embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A method of fabricating an array substrate, comprising:
providing a substrate;
sequentially forming a first semiconductor material layer, a second semiconductor material layer, and a photoresist layer on the substrate, wherein a material of one of the first semiconductor material layer and the second semiconductor material layer is low-temperature polysilicon, and a material of the other semiconductor material layer has a carrier mobility less than a carrier mobility of the low-temperature polysilicon;
exposing and developing the photoresist layer using a halftone mask to form a first protective layer, second protective layers, and a third protective layer, wherein the second protective layers are connected to both sides of the first protective layer, a thickness of the first protective layer is greater than that of the second protective layers, and the third protective layer is spaced apart from the first protective layer and the second protective layers;
removing the first semiconductor material layer and the second semiconductor material layer not covered by the first protective layer, the second protective layers, and the third protective layer by a first etching to form a first semiconductor layer and a third semiconductor layer;
ashing to remove the second protective layers and the third protective layer and thin the first protective layer;
removing the second semiconductor material layer not covered by the first protective layer by a second etching to form a second semiconductor layer; and
removing the first protective layer.

2. The method of fabricating the array substrate according to claim 1, wherein the material having the carrier mobility less than the carrier mobility of the low-temperature polysilicon comprises one or more of a metal oxide semiconductor, a metal nitride semiconductor, a metal oxynitride semiconductor, and an amorphous silicon.

3. The method of fabricating the array substrate according to claim 1, wherein the material of the first semiconductor layer is low-temperature polysilicon, and the material of the second semiconductor layer has the carrier mobility less than the carrier mobility of the low-temperature polysilicon.

* * * * *